United States Patent
Zhang et al.

(10) Patent No.: US 12,237,477 B2
(45) Date of Patent: *Feb. 25, 2025

(54) STATE OF CHARGE DEPENDENT PLATING ESTIMATION AND PREVENTION

(71) Applicant: CPS Technology Holdings LLC, New York, NY (US)

(72) Inventors: Zhenli Zhang, Glendale, WI (US); Zhihong Jin, Pewaukee, WI (US); Perry M. Wyatt, Wilton, CT (US)

(73) Assignee: CPS Technology Holdings LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/540,665

(22) Filed: Dec. 14, 2023

(65) Prior Publication Data
US 2024/0120558 A1 Apr. 11, 2024

Related U.S. Application Data

(63) Continuation of application No. 17/958,926, filed on Oct. 3, 2022, now Pat. No. 11,848,426, which is a (Continued)

(51) Int. Cl.
*H01M 10/0525* (2010.01)
*G01R 31/367* (2019.01)
(Continued)

(52) U.S. Cl.
CPC ........ *H01M 10/425* (2013.01); *G01R 31/367* (2019.01); *G01R 31/382* (2019.01); (Continued)

(58) Field of Classification Search
None
See application file for complete search history.

(56) References Cited

U.S. PATENT DOCUMENTS

| 11,462,774 B2 | 10/2022 | Zhang |
| 2017/0203654 A1 | 7/2017 | He |
| 2017/0309973 A1* | 10/2017 | Haug ................ G01B 7/24 |

FOREIGN PATENT DOCUMENTS

| DE | 102013204527 A1 | 9/2014 |
| EP | 2048735 A1 | 4/2009 |
| JP | 2014032825 A | 2/2014 |

OTHER PUBLICATIONS

International Search Report and Written Opinion for PCT/US2017/054939 mailed Dec. 15, 2017, 20 pages.
(Continued)

*Primary Examiner* — Roy Y Yi
(74) *Attorney, Agent, or Firm* — Boardman & Clark LLC

(57) ABSTRACT

A battery system includes a lithium ion battery configured to couple to an electrical system, and a battery management system configured to electrically couple to the lithium ion battery and to control one or more recharge parameters of the lithium ion battery. The battery management system is programmed with an electrochemical model, and the battery management system is configured to monitor parameters of the lithium ion battery, and to control the one or more recharge parameters of the lithium ion battery based on the electrochemical model and the one or more monitored parameters. The electrochemical model determines lithium plating reaction kinetics at an anode of the lithium ion battery, determines a quantity of plated lithium at the anode of the lithium ion battery, or both, and indicates a relationship between the one or more monitored parameters and the lithium plating reaction kinetics, the quantity of plated lithium, or both.

20 Claims, 14 Drawing Sheets

Related U.S. Application Data continuation of application No. 16/338,994, filed as application No. PCT/US2017/054939 on Oct. 3, 2017, now Pat. No. 11,462,774.

(60) Provisional application No. 62/403,574, filed on Oct. 3, 2016.

(51) Int. Cl.
*G01R 31/382* (2019.01)
*G01R 31/392* (2019.01)
*H01M 4/583* (2010.01)
*H01M 4/587* (2010.01)
*H01M 10/42* (2006.01)
*H01M 10/44* (2006.01)
*H01M 10/48* (2006.01)

(52) U.S. Cl.
CPC .......... *G01R 31/392* (2019.01); *H01M 4/583* (2013.01); *H01M 4/587* (2013.01); *H01M 10/0525* (2013.01); *H01M 10/44* (2013.01); *H01M 10/48* (2013.01); *H01M 10/486* (2013.01); *H01M 2010/4271* (2013.01); *H01M 2220/20* (2013.01); *Y02T 10/70* (2013.01)

(56) References Cited

OTHER PUBLICATIONS

Jaguemont et al. "Low Temperature Aging Tests for Lithium-ion Batteries" 2015 IEEE 24th International Symposium on Industrial Electronics (ISIE), 2015, pp. 1284-1289 (Year: 2015).

* cited by examiner

| ANODE | | SEPARATOR | CATHODE | |
|---|---|---|---|---|
| SOLID PHASE | INTERFACE | LIQUID PHASE | INTERFACE | SOLID PHASE |
| INSIDE PARTICLE DIFFUSION | BUTLER-VOLMER KINETICS | LITHIUM ION DIFFUSION AND MIGRATION | BUTLER-VOLMER KINETICS | INSIDE PARTICLE DIFFUSION |

STATE OF CHARGE DEPENDENT PLATING ESTIMATION AND PREVENTION

CROSS REFERENCE TO RELATED APPLICATIONS

This application is a Continuation Application of U.S. patent application Ser. No. 17/958,926, entitled "STATE OF CHARGE DEPENDENT PLATING ESTIMATION AND PREVENTION," filed Oct. 3, 2022, now U.S. Pat. No. 11,848,426, which is a Continuation Application of U.S. patent application Ser. No. 16/338,994 entitled "STATE OF CHARGE DEPENDENT PLATING ESTIMATION AND PREVENTION," filed Apr. 2, 2019, now U.S. Pat. No. 11,462,774; which is a U.S. National Stage Application under 35 U.S.C. § 371 of International Application No. PCT/US2017/054939 entitled "STATE OF CHARGE DEPENDENT PLATING ESTIMATION AND PREVENTION," filed on Oct. 3, 2017; which claims priority to and the benefit of U.S. Provisional Application No. 62/403,574, entitled "STATE OF CHARGE ("SOC") DEPENDENT PLATING ESTIMATION AND PREVENTION," filed Oct. 3, 2016. Each of the proceeding applications are incorporated herein by reference.

BACKGROUND

The present disclosure generally relates to the field of batteries and battery modules. More specifically, the present disclosure relates to controlling charging operations of lithium ion batteries to reduce a likelihood of lithium plating on anodes of the lithium ion batteries.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 Volt (V) or 130 V systems. The term HEV may include any variation of a hybrid electric vehicle. For example, full hybrid electric vehicles (FHEVs) may provide motive and other electrical power to the vehicle using one or more electric motors, using only an internal combustion engine, or using both. In contrast, mild hybrid electric vehicles (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assistance, during acceleration for example, to supplement the internal combustion engine. Mild hybrids are typically 96V to 130V and recover braking energy through a belt or crank integrated starter generator. Further, a micro-hybrid electric vehicle (mHEV) also uses a "Stop-Start" system similar to the mild hybrids, but the micro-hybrid systems of a mHEV may or may not supply power assistance to the internal combustion engine and operates at a voltage below 60V. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

As technology continues to evolve, there is a need to provide improved power sources, particularly battery modules, for such vehicles. For example, the electric power used by the xEVs may be stored in lithium ion batteries. In some cases, active lithium ions within the lithium ion batteries of xEVs may deposit on an anode of the lithium ion batteries under certain conditions driving a charging operation of the lithium ion batteries. This effect is widely known as lithium plating, and the lithium plating may result in degradation of the lithium ion battery. The present disclosure is generally related to establishing dynamic parameters for charging operations to limit lithium plating on the anode of the lithium ion battery.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates to a battery system. The battery system includes a lithium ion battery configured to couple to an electrical system, and a battery management system configured to electrically couple to the lithium ion battery and configured to control one or more recharge parameters of the lithium ion battery. The battery management system is programmed with an electrochemical model, and the battery management system is configured to monitor parameters of the lithium ion battery, and to control the one or more recharge parameters of the lithium ion battery based on the electrochemical model and the one or more monitored parameters. The electrochemical model determines lithium plating reaction kinetics at an anode of the lithium ion battery, determines a quantity of plated lithium at the anode of the lithium ion battery, or a combination thereof, and indicates a relationship between the one or more monitored parameters and the lithium plating reaction kinetics, the quantity of plated lithium, or the combination thereof.

The present disclosure also relates to a method to control a charging operation of a lithium ion battery. The method includes measuring one or more parameters of the lithium ion battery during the charging operation; determining lithium plating reaction kinetics at an anode of the lithium ion battery using an electrochemical model, determining a quantity of plated lithium at the anode of the lithium ion battery, or a combination thereof; indicating a relationship between the one or more monitored parameters and the lithium plating reaction kinetics, the quantity of plated lithium, or the combination thereof using the electrochemical model; and controlling the charging operation of the lithium ion battery based on the indicated relationship.

The present disclosure also relates to a lithium ion battery including a housing; a plurality of lithium ion battery cells disposed in the housing; one or more sensors disposed in the housing and configured to monitor one or more parameters of the plurality of lithium ion battery cells; and a battery management system communicatively coupled to the one or more sensors and disposed in the housing. The battery management system is configured to control a charging operation of the lithium ion battery, and is programmed with an electrochemical model comprising equations describing lithium plating reaction kinetics and quantifying plated lithium as a function of the lithium plating reaction kinetics. The battery management system is configured to use the electrochemical model to dynamically control the charging operation based on the one or more monitored parameters and modeled charging parameters generated by the electrochemical model to prevent lithium plating at an anode of the plurality of lithium ion battery cells.

BRIEF DESCRIPTION OF THE DRAWINGS

Various aspects of this disclosure may be better understood upon reading the following detailed description and upon reference to the drawings in which.

DETAILED DESCRIPTION

Figure 1:
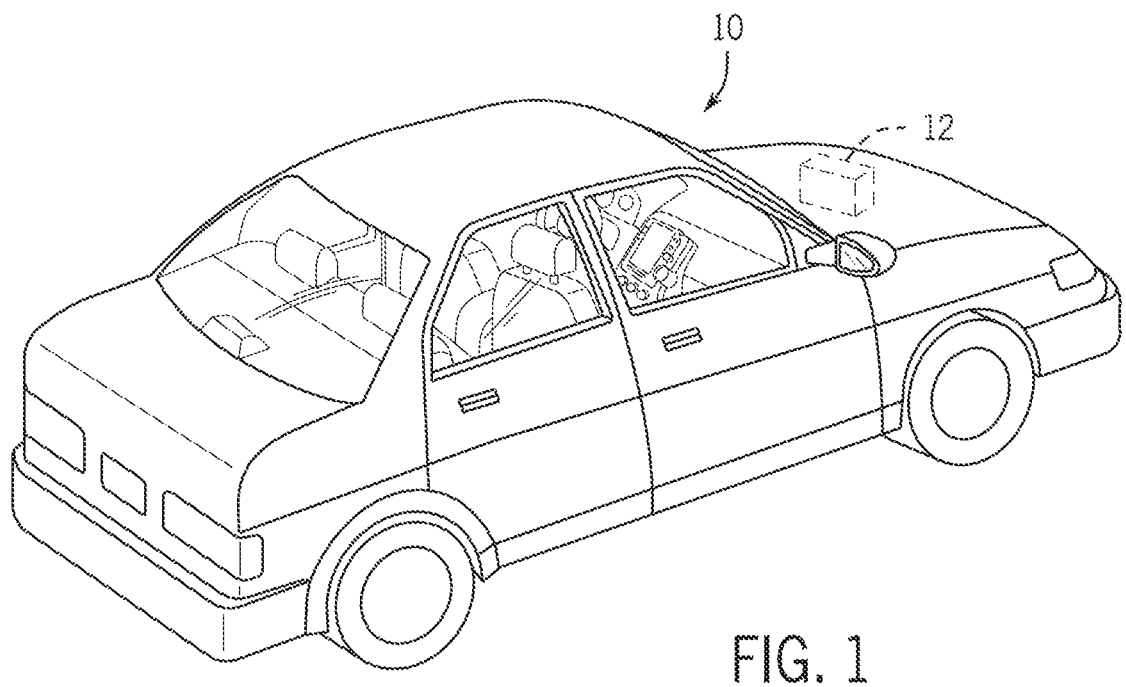
FIG. 1 is perspective view of a vehicle (an xEV) having a battery system contributing all or a portion of the power for the vehicle, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The battery systems described herein may be used to provide power to various types of electric vehicles (xEVs) and other high voltage energy storage/expending applications (e.g., electrical grid power storage systems). Such battery systems may include one or more battery modules, each battery module having a number of battery cells (e.g., lithium-ion (Li-ion) electrochemical cells) arranged and electrically interconnected to provide particular voltages and/or currents useful to power, for example, one or more components of an xEV. As another example, battery modules in accordance with present embodiments may be incorporated with or provide power to stationary power systems (e.g., non-automotive systems).

Based on the advantages over traditional gas-powered vehicles, manufactures, which generally produce traditional gas-powered vehicles, may desire to utilize improved vehicle technologies (e.g., regenerative braking technology) within their vehicle lines. Often, these manufacturers may utilize one of their traditional vehicle platforms as a starting point. Accordingly, since traditional gas-powered vehicles are designed to utilize 12 volt battery systems, a 12 volt lithium ion battery may be used to supplement a 12 volt lead-acid battery. More specifically, the 12 volt lithium ion battery may be used to more efficiently capture electrical energy generated during regenerative braking and subsequently supply electrical energy to power the vehicle's electrical system.

As advancements occur with vehicle technologies, relatively high voltage electrical devices may also be included in the vehicle's electrical system. For example, the lithium ion battery may supply electrical energy to an electric motor in a mild-hybrid vehicle. Often, these high voltage electrical devices utilize voltage greater than 12 volts, for example, up to 48 volts. Accordingly, in some embodiments, the output voltage of a 12 volt lithium ion battery may be boosted using a DC-DC converter to supply power to the high voltage devices. Additionally or alternatively, a 48 volt lithium ion battery may be used to supplement a 12 volt lead-acid battery. More specifically, the 48 volt lithium ion battery may be used to more efficiently capture electrical energy generated during regenerative braking and subsequently supply electrical energy to power the high voltage devices.

Thus, the design choice regarding whether to utilize a 12 volt lithium ion battery or a 48 volt lithium ion battery may depend directly on the electrical devices included in a particular vehicle. Nevertheless, although the voltage characteristics may differ, the operational principles of a 12 volt lithium ion battery and a 48 volt lithium ion battery are generally similar More specifically, as described above, both may be used to capture electrical energy during regenerative braking and subsequently supply electrical energy to power electrical devices in the vehicle.

Accordingly, to simplify the following discussion, the present techniques will be described in relation to a battery system with a 12 volt lithium ion battery and a 12 volt lead-acid battery. However, one of ordinary skill in art is able to adapt the present techniques to other battery systems, such as a battery system with a 48 volt lithium ion battery and a 12 volt lead-acid battery.

As generally set forth above, the present disclosure relates to limiting lithium plating at anodes of lithium ion batteries. For example, the present disclosure provides, among other things, certain systems and approaches for monitoring and mitigating such lithium plating, based on experimental observations. When a lithium ion battery charges, it may be advantageous to limit certain charge parameters to lessen the likelihood of lithium plating at the anodes of the lithium ion batteries. To reduce the likelihood of lithium plating while still maintaining an efficient charge rate, limits to various charge parameters may be dynamically altered to correspond to measured parameters (e.g., charge current, temperature, or state of charge of the lithium ion battery) presently experienced by the lithium ion battery, which may affect the lithium ion battery's propensity toward experiencing lithium plating.

With the preceding in mind, the present disclosure describes systems and methods for controlling charging operations of a battery system to prevent the lithium ion batteries from experiencing lithium plating on anodes of the lithium ion batteries. Traditionally, to combat lithium plating, lithium ion battery manufacturers have provided a current limit for charging operations of lithium ion batteries. However, these current limits are often overly conservative for the specific circumstances surrounding a lithium ion battery, which may result in inefficient charging operations by unnecessarily limiting charge current levels. In addition, such charge current limits are often established based on constant current charging. While constant current charging is useful in certain applications such as in EVs and PHEVs, other applications such as hybrid vehicles (e.g., mild hybrids, micro hybrids) may, in some instances, use pulse charging. Indeed, it is now recognized that pulsed charging currents may have different lithium plating dynamics than continuous charging currents. It is also now recognized that the current limits for such pulsed charging currents can more appropriately be determined using the systems and methods described herein, as opposed to basing the current limits on continuous charging current limits.

In accordance with the present disclosure, a battery management system may utilize an advanced method that prevents plating and estimates plating in a more accurate manner as compared with traditional methods. The battery management system of the present disclosure thereby maximizes the battery performance in service while preventing plating and related aging. As an example, it is now recognized that the "plating current," or the current at which lithium plating at the anode occurs, is a strong function of both temperature and state of charge for pulsed charging regimes.

Various methods to construct one or more models used by the battery management system to quantify and prevent plating are also described herein. For example, the present disclosure provides an electrochemical model that explicitly accounts for the lithium plating reaction. The model enables both determination of plating onset and quantification of plated lithium. The battery management systems described herein may, for instance, measure operating parameters of the lithium ion batteries and, using such a model, control the charging operations to avoid operating parameter values of the lithium ion batteries that may result in an increased likelihood of lithium plating on the anodes based not only on instant values of the monitored parameters, but also based on quantified lithium plating, the state of the lithium ion battery based on historical usage, and so forth, generated by the model.

To help illustrate, FIG. 1 is a perspective view of an embodiment of a vehicle 10, which may utilize a regenerative braking system. Although the following discussion is presented in relation to vehicles with regenerative braking systems, the techniques described herein are adaptable to other vehicles that capture/store electrical energy with a battery, which may include electric-powered and gas-powered vehicles.

As discussed above, it would be desirable for a battery system 12 to be largely compatible with traditional vehicle designs. Accordingly, the battery system 12 may be placed in a location in the vehicle 10 that would have housed a traditional battery system. For example, as illustrated, the vehicle 10 may include the battery system 12 positioned similarly to a lead-acid battery of a typical combustion-engine vehicle (e.g., under the hood of the vehicle 10). Furthermore, as will be described in more detail below, the battery system 12 may be positioned to facilitate managing temperature of the battery system 12. For example, in some embodiments, positioning a battery system 12 under the hood of the vehicle 10 may enable an air duct to channel airflow over the battery system 12 and cool the battery system 12. The battery system 12 may include or be associated with a battery management system that is programmed to perform monitoring, estimation, and control of the battery system 12 to limit lithium plating, as described in further detail below.

Figure 2:
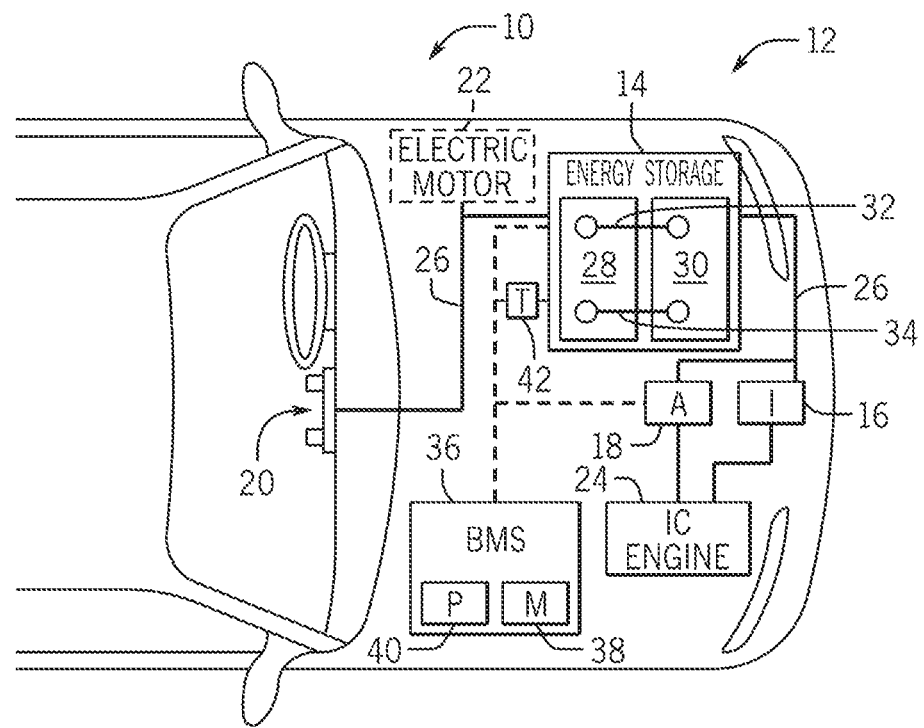
FIG. 2 is a cutaway schematic view of the xEV of FIG. 1 in the form of a hybrid electric vehicle (HEV), in accordance with an embodiment of the present disclosure.

A more detailed view of the battery system 12 is described in FIG. 2. As depicted, the battery system 12 includes an energy storage component 14 coupled to an ignition system 16, an alternator 18, a vehicle console 20, and optionally to an electric motor 22. Generally, the energy storage component 14 may capture/store electrical energy generated in the vehicle 10 and output electrical energy to power electrical devices in the vehicle 10.

In other words, the battery system 12 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. Illustratively, in the depicted embodiment, the energy storage component 14 supplies power to the vehicle console 20 and the ignition system 16, which may be used to start (e.g., crank) an internal combustion engine 24.

Additionally, the energy storage component 14 may capture electrical energy generated by the alternator 18 and/or the electric motor 22. In some embodiments, the alternator 18 may generate electrical energy while the internal combustion engine 24 is running More specifically, the alternator 18 may convert the mechanical energy produced by the rotation of the internal combustion engine 24 into electrical energy. Additionally or alternatively, when the vehicle 10 includes an electric motor 22, the electric motor 22 may generate electrical energy by converting mechanical energy produced by the movement of the vehicle 10 (e.g., rotation of the wheels) into electrical energy. Thus, in some embodiments, the energy storage component 14 may capture electrical energy generated by the alternator 18 and/or the electric motor 22 during regenerative braking. As such, the alternator 18 and/or the electric motor 22 are generally referred to herein as a regenerative braking system.

To facilitate capturing and supplying electric energy, the energy storage component 14 may be electrically coupled to the vehicle's electric system via a bus 26. For example, the bus 26 may enable the energy storage component 14 to receive electrical energy generated by the alternator 18 and/or the electric motor 22. Additionally, the bus 26 may enable the energy storage component 14 to output electrical energy to the ignition system 16 and/or the vehicle console 20. Accordingly, when a 12 volt battery system 12 is used, the bus 26 may carry electrical power typically between 8-18 volts.

Additionally, as depicted, the energy storage component 14 may include multiple battery modules. For example, in the depicted embodiment, the energy storage component 14 includes a lead acid (e.g., a first) battery module 28 in accordance with present embodiments, and a lithium ion (e.g., a second) battery module 30, where each battery module 28, 30 includes one or more battery cells. In other embodiments, the energy storage component 14 may include any number of battery modules. Additionally, although the first battery module 28 and the second battery module 30 are depicted adjacent to one another, they may be positioned in different areas around the vehicle. For example, the second battery module 30 may be positioned in or about the interior of the vehicle 10 while the first battery module 28 may be positioned under the hood of the vehicle 10.

In some embodiments, the energy storage component 14 may include multiple battery modules to utilize multiple different battery chemistries. For example, the first battery module 28 may utilize a lead-acid battery chemistry and the second battery module 30 may utilize a lithium ion battery chemistry. In such an embodiment, the performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

To facilitate supply of power from the battery system 12 to the various components in the vehicle's electrical system (e.g., HVAC system and vehicle console 20), the energy storage component 14 (i.e., battery module) includes a first terminal 32 and a second terminal 34. In some embodiments, the second terminal 34 may provide a ground connection and the first terminal 32 may provide a positive voltage ranging between 7-18 volts.

In still further embodiments, the energy storage component 14 may only include a single battery module, such as the lithium ion battery module 30. In such embodiments, the lithium ion battery module 30 may have electrical characteristics that enable it to replace a traditional lead-acid battery. By way of example, the lithium ion battery module 30 may be a 12V starter battery.

As illustrated, the energy storage component may be associated with a battery management system (BMS) 36. As used herein, the BMS 36 generally refers to control components that control operation of the battery system 12, such as relays within the battery module or switches in the alternator 18. Additionally, the BMS 36 may be disposed within the lithium ion battery module 30 (e.g., within a housing of the module), or the BMS 36 may be remote to the lithium ion battery module 30, as depicted in FIG. 2. As also shown in FIG. 2, the operation of the lithium ion battery module 30, and indeed the energy storage component 14, may be controlled by the BMS 36. For example, the BMS 36 may regulate an amount of electrical energy captured/supplied by each battery module 28 or 30 (e.g., to de-rate and re-rate the battery system 12), perform load balancing between the battery modules 28, 30, control charging and discharging of the battery modules 28, 30 (e.g., via relays or DC/DC converters), determine a state of charge of each battery module 28, 30 and/or the entire energy storage component 14, activate an active cooling mechanism, activate a short circuit protection system, and the like.

Accordingly, the BMS 36 may include a memory 38 and a processor 40 programmed to execute control algorithms for performing such tasks. More specifically, the processor 40 may include one or more application specific integrated circuits (ASICs), one or more field programmable gate arrays (FPGAs), one or more general purpose processors, or any combination thereof. Additionally, the memory 38 may include volatile memory, such as random access memory (RAM), and/or non-volatile memory, such as read-only memory (ROM), optical drives, hard disc drives, or solid-state drives. In some embodiments, the BMS 36 may include portions of a vehicle control unit (VCU) and/or a separate battery control module. Additionally, as depicted, the BMS 36 may be included separate from the energy storage component 14, such as a standalone module. In other embodiments, the BMS 36 may be included within the energy storage component 14.

Additionally, as depicted in FIG. 2, the lead-acid battery 28 and the lithium ion battery module 30 are connected in parallel across the first terminal 32 and the second terminal 34 to enable charging and discharging of the batteries. As described above, the battery terminals 32 and 34 may output the power stored in the energy storage component 14 to provide power to the vehicle's electrical system. Further, the battery terminals 32 and 34 may also input power to the energy storage component 14 to enable the lead-acid battery 28 and the lithium ion battery module 30 to charge, for example, when the alternator 18 generates electrical power through regenerative braking.

Figure 3:
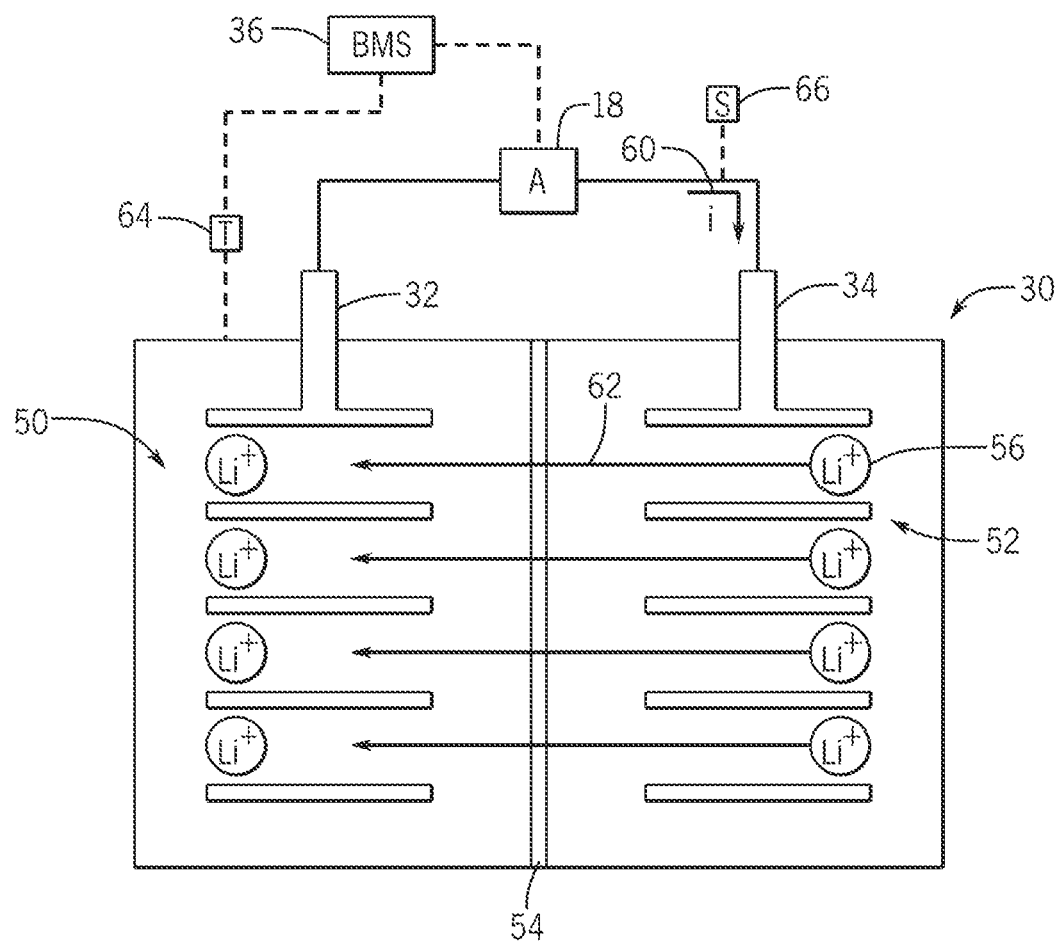
FIG. 3 is a schematic view of a lithium ion battery, in accordance with an embodiment of the present disclosure.

To provide more detail as to the charging process of the lithium ion battery module 30, FIG. 3 illustrates a schematic view of components of the lithium ion battery module 30. For simplicity, the lithium ion battery module 30 is depicted schematically to show the various internal components of a constituent battery cell contained within the lithium ion battery module 30. In other words, the internals of the lithium ion battery module 30 shown in FIG. 3 are simplified to facilitate discussion. However, it should be appreciated that there are a number of additional components internal to the lithium ion battery module that are not specifically shown, such as a plurality of battery cells, bus bars used to connect the battery cells, and so forth.

Figure 4:
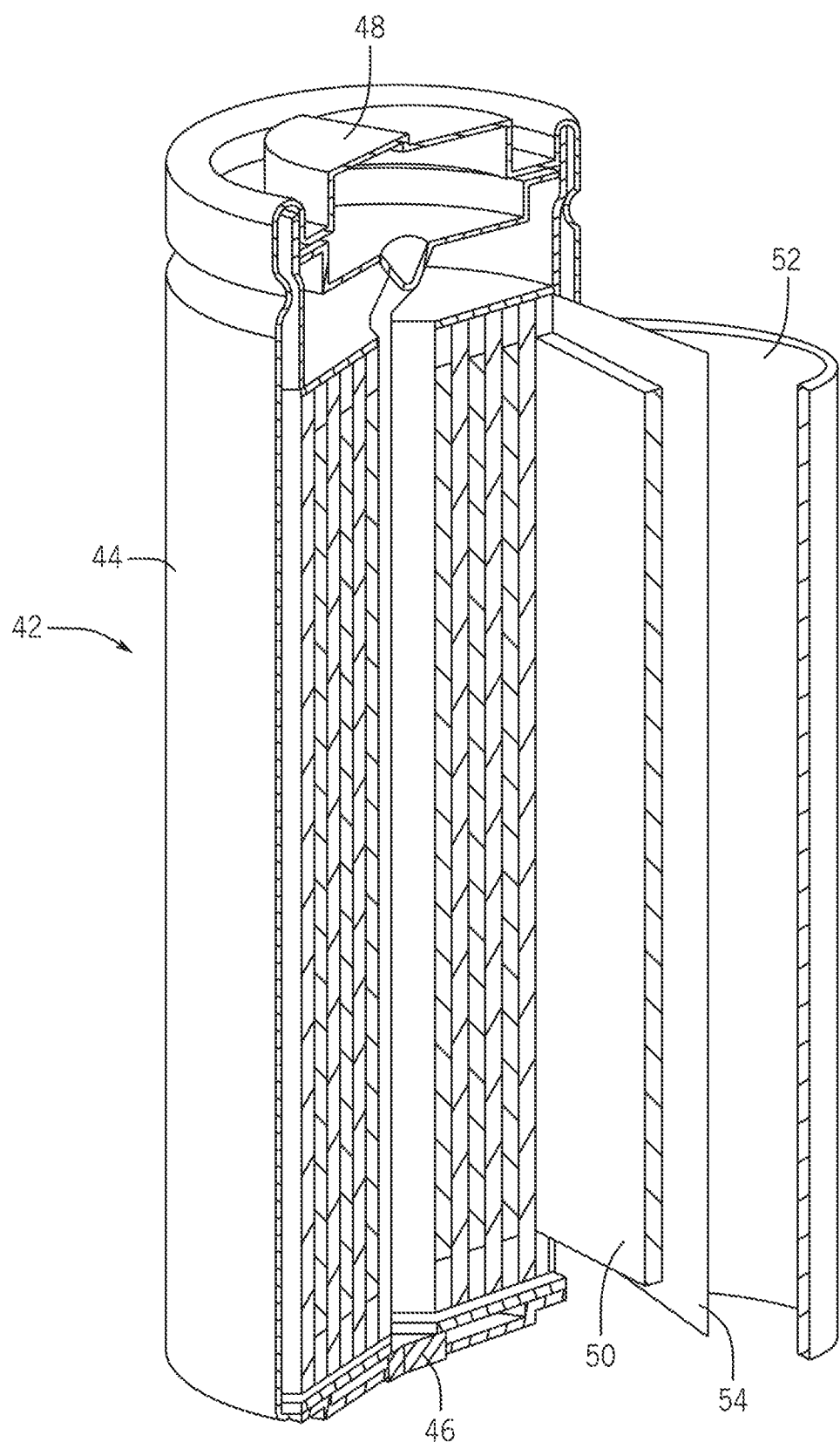
FIG. 4 is a cutaway view of a lithium ion battery cell with a spiral wound cell structure, in accordance with an embodiment of the present disclosure.

Turning briefly to FIG. 4, for instance, a cutaway view of a lithium ion battery cell 42 with a spiral wound cell structure is illustrated. Specifically, the battery cell 42 has a cell housing or cell casing 44, which may take many forms but is illustrated as cylindrical. Other embodiments of the lithium ion battery cell 42 may have, for example, a prismatic shape or a pouch configuration for the cell casing 44.

The lithium ion battery cell 42 also includes a first cell terminal 46 and a second cell terminal 48. While shown as being positioned at opposing sides of the cell casing 44, other embodiments may have the terminals 46, 48 positioned on the same side of the cell casing 44. The first and second cell terminals 46, 48 of the lithium ion battery cell 42 enable electrical connection with other lithium ion battery cells, as well as to the first and second terminals 32, 34 of the lithium ion battery module 30. As shown, the lithium ion battery cell 42 includes an anode 50 and a cathode 52 separated by a separator 54, which are wrapped in a spiral wound configuration within the lithium ion battery cell 42. An electrolyte enables shuttling of lithium ions 56 between the anode 50 and the cathode 52 across the separator 54, as schematically shown in FIG. 3.

For example, the second terminal 34 may electrically couple to the cathode 52 (e.g., via the first cell terminal 46) and the first terminal 32 may electrically couple to the anode 50 (e.g., via the second cell terminal 48). Accordingly, the lithium ion battery cell 42 depicted in FIG. 4 may be electrically coupled to the alternator 18 and the BMS 36 in a similar manner to the schematic representation of the lithium ion battery module 30 depicted in FIG. 3. Indeed, the term "lithium ion battery" may be used herein to refer to the battery module 30 and the battery cell 42 unless otherwise specified.

The anode 50, cathode 52, and separator 54 (in addition to an electrolyte) function to enable lithium ion shuttling, intercalation, and deintercalation to deliver and receive electrical energy. The anode 50 includes an anode active material including carbon (e.g., graphite), silicon, silicon dioxide, lithium titanate, or any other suitable material. The cathode 52 may include any appropriate cathode active material, for example lithium metal oxides and lithium mixed metal oxides of cobalt, manganese, nickel, aluminum, iron or any other suitable material, or phosphates of iron. Non-limiting examples include lithium nickel manganese cobalt oxide (NMC), lithium iron phosphate (LFP), and the like. The separator 54 may be a polymeric material (e.g., polypropylene and/or polyethylene material) that provides electrical separation between the anode 50 and the cathode 52 while allowing the lithium ions 56 to pass through in an unobstructed manner.

Referring again to FIG. 3, during a charging operation, the lithium ions 56 are driven toward and intercalated into the anode 50, and are driven away and deintercalated from the cathode 52 due to the electrochemical characteristics of the anode active material and the cathode active material. For example, during a charging operation of the lithium ion battery module 30, an electric current 60 is applied to the lithium ion battery module 30. The charging operation may use power generated by the internal combustion engine 24 or power generated by regenerative braking to apply the current 60. Application of the electric current 60 causes lithium ion deintercalation at the cathode 52 and lithium ion insertion at the anode 50. As the lithium ions 56 travel to the anode 50 along a path 62 via an electrolyte, a state of charge of the lithium ion battery module 30 increases.

To control charging of the lithium ion battery module 30, the BMS 36 may receive inputs from sensors and may control application of power from a power source (e.g., the alternator 18) to the cathode 52. To facilitate this control, the lithium ion battery module 30 may include a temperature sensor 64 and/or additional sensors 66 communicatively coupled to the BMS 36. The additional sensors 66 may measure, for example, voltage and/or current applied to the first terminal 32 and/or the second terminal 34.

In accordance with present embodiments, the charging control performed by the BMS 36 may be based on feedback generated by the temperature sensor 64 and/or the additional sensors 66, as well as a number of other factors. For example, the BMS 36 may perform charging control to maximize charging efficiency while minimizing the likelihood of irreversible lithium plating at the anode 50. In general, several factors may influence lithium plating on the anode 50, and the model-based control utilized by the BMS 36 may account for such factors. For example, in a general sense, as a state of charge of the lithium ion battery module 30 increases, a likelihood of lithium plating also increases. Similarly, as the state of charge of the lithium ion battery module 30 decreases, the likelihood of lithium plating decreases. Additionally, greater current levels applied to the lithium ion battery module 30 may increase the likelihood of lithium plating, a decrease in voltage at an interface between the separator 54 and the anode 50 may increase the likelihood of lithium plating, and a decrease in temperature of the lithium ion battery module 30 may also increase the likelihood of lithium plating. Accordingly, the BMS 36 may control the application of power by the alternator 18 to the lithium ion battery module 30 in a number of ways to limit the likelihood of lithium plating on the anode 50 in view of the factors described above.

For example, under certain conditions, lithium plating may occur on the anode 50 at an interface between the anode 50 and the separator 54 as the lithium ions 56 are deposited on the material that makes up the anode 50. For instance, charging the lithium ion battery module 30 at −40 degrees Celsius may result in a heightened likelihood of lithium plating on the anode 50. Lithium plating may result in battery degradation as the lithium ions 56 deposited on the anode 50 effectively remove active lithium ions 56 from future electrochemical reactions within the lithium ion battery module 30. Accordingly, a lifespan of the battery 30 may be significantly reduced due to lithium plating on the anode 50 during charging operations. Therefore, it may be desirable to avoid the certain conditions that result in a greater likelihood of lithium plating on the anode 50 by controlling the application of power from the alternator 18 to the cathode 52 during regenerative braking or when the alternator 18 converts mechanical movement of the internal combustion engine 24 into electrical power to charge the energy storage component 14.

For example, the current 60 applied during a charging operation may be limited to different levels depending on the state of charge of the lithium ion battery module 30, the temperature of the lithium ion battery module 30, a duration and/or frequency of charging pulses applied to the battery 30, or any other factor that may influence the likelihood of lithium plating on the anode 50. Because these conditions may change over time, the BMS 36 may dynamically control the power output of the alternator 18 into the lithium ion battery module 30 during the charging operation. Therefore, the likelihood of the anode 50 experiencing lithium plating may not correspond to a specific level of the current 60. Rather, the likelihood of lithium plating at a specific level of the current 60 may vary based on the various factors discussed above.

Figure 5:
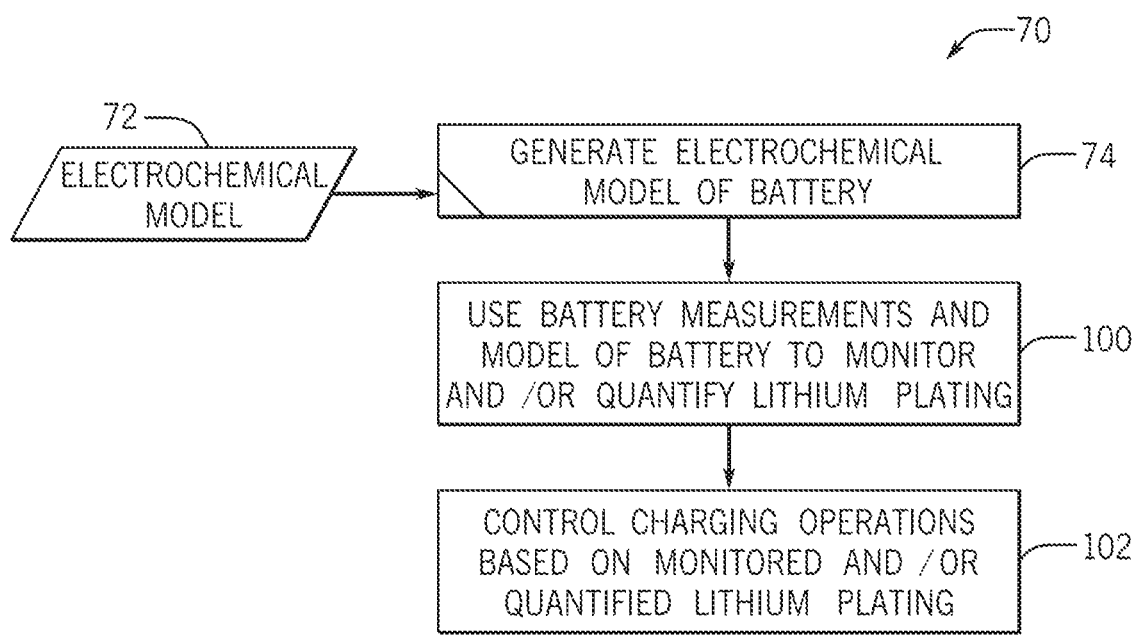
FIG. 5 is a process flow diagram describing a method for reducing the likelihood of lithium plating on an anode of a battery based on an electrochemical model of the battery, in accordance with an embodiment of the present approach.

To illustrate the functionality of the BMS 36, FIG. 5 is a process flow diagram describing a method 70 for controlling charging operations using an electrochemical model 72 of the lithium ion battery module 30. Initially, at block 74, the electrochemical model 72 of the lithium ion battery module 30 may be generated. The electrochemical model 72 of the lithium ion battery module 30 may estimate any number of parameters relating to the lithium ion battery module 30. As an example, the electrochemical model 72 may be used to identify the onset of lithium plating at the anode 50, to obtain reaction kinetics for lithium plating at the anode 50, to estimate the amount of lithium plating at the anode 50, or a combination thereof. Additionally or alternatively, the electrochemical model 72 may be used to determine current limits for pulsed charging currents applied to the lithium ion battery module 30, to develop a quantitative current map to prevent lithium plating at the anode 50 during charging operations, and similar features.

By way of example, the electrochemical model 72 may be an extensive mathematical model that solves for dependent variables, such as electrolyte concentration, electrolyte potential, solid concentration, solid potential, reaction rate, local current density, etc., using governing equations based on porous electrode theory and concentrated electrolyte theory, among others. The electrochemical model 72 may be based on, or include fundamental equations relating to lithium transport between the anode 50 and the cathode 52.

Figures 6, 7:
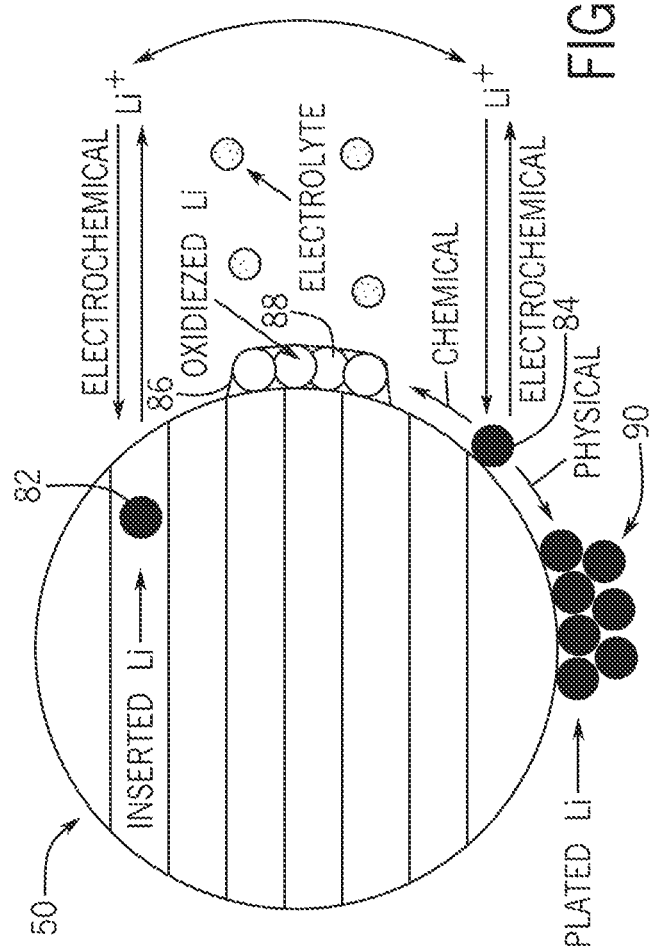
FIG. 6 is a schematic representation of an electrochemical model including a framework for describing reactions at an anode, a separator, and a cathode of a lithium ion battery cell, in accordance with an embodiment of the present approach.
FIG. 7 is a schematic of the major reactions involved in lithium plating at an anode of a battery cell, in accordance with an embodiment of the present approach.

To help illustrate, FIG. 6 is a schematic representation of the electrochemical model 72, or at least a portion thereof, of the various battery cell components described above. As shown, the electrochemical model 72 includes an anode framework 76, a cathode framework 78, and a separator framework 80, where each framework represents one or more equations (e.g., a system of equations) that model lithium behavior at different electrochemically active regions of the battery cell 42. The anode framework 76 and the cathode framework 78 of the electrochemical model 72 include solid phase and interface portions, and the separator framework 80 includes a liquid phase portion. The solid phase portions of the anode and the cathode frameworks 76, 78 include equations relating to lithium diffusion in electrochemically active particles (e.g., the anode and cathode active materials). The equations in the solid phase portion are also governed by the solid phase Ohm's law. The liquid phase portion of the separator framework 80 relates to lithium ion diffusion and migration in the liquid phase (the electrolyte). This portion is governed by the liquid phase Ohm's law.

The interface portions of the anode and the cathode frameworks 76, 78 include one or more Butler-Volmer equations to model the behavior of lithium at the interface between the anode 50 and the separator 54, and the interface between the cathode 52 and the separator 54. It is now recognized that, from the standpoint of generating the electrochemical model 72 to account for lithium plating behavior, the interface between the anode 50 and the separator 54 is the most likely area where lithium plating will occur.

FIG. 7 illustrates a schematic of the major reactions involved in lithium plating at the anode 50, which in this embodiment is assumed to be graphite-based. The reactions include the main reaction of lithium insertion into the layered structure of carbon. This may be considered an electrochemical reaction to produce inserted lithium 82 (e.g., lithium carbide). This electrochemical reaction has no impact on cell degradation. The reactions also include the plating reaction, which is electrochemical in nature and produces solid lithium particles 84. The solid lithium particles 84 may be reinserted into the anode 50 (e.g., by re-oxidation and insertion), or may undergo further reaction. When the solid lithium particles 84 are reinserted into the anode 50, this has no impact on cell degradation. The other reactions of the solid lithium particles 84 include further reaction with the electrolyte, the reaction being chemical in nature to produce a passivation layer 86 of oxidized lithium particles 88. The production of the passivation layer 86 accelerates aging of the battery cell 42 by causing capacity loss and an increase in resistance. As also shown, the solid lithium particles 84 may undergo a physical reaction to accumulate and form plated lithium 90. This reaction is substantially irreversible and will cause capacity loss and possible thermal runaway issues for the battery cell 42.

Returning to FIG. 6, in accordance with present embodiments, the anode framework 76 includes Butler-Volmer equations that consider the lithium plating reaction. Equation (1) describes the Butler-Volmer kinetics of the plating reaction, which may enable the BMS 36 to determine the onset of lithium plating and monitor the progress of the plating reaction. In an embodiment, equation (1) is as follows:

$$i_p = a_v i_{0,p} \left[ \frac{c_{l,ref}}{c_l} \exp\left(\frac{\alpha_a F \eta_p}{RT}\right) - \frac{c_l}{c_{l,ref}} \exp\left(\frac{-\alpha_c F \eta_p}{RT}\right) \right] \quad (1)$$

where $i_p$ is the plating current (A/m3), $\alpha_v$ is the specific surface area of active material (m2/m3), $i_{0,p}$ is the plating exchange current (A/m2), $C_{l,ref}$ is the reference lithium salt concentration (1M), $c_l$ is the lithium salt concentration (mol/m3), $\alpha_a$ a is the anodic charge transfer current, F is the Faraday constant, np is the plating over potential (V), R is the universal gas constant, T is temperature, and ac is the cathodic charge transfer current.

Equation (2) calculates the plated lithium as a result of the plating reaction. In an embodiment, equation (2) is as follows:

$$\frac{\partial \varepsilon_{Li}}{\partial t} = -\frac{M_{Li}}{\rho_{Li} F} i_p + f(k, \varepsilon_{Li}) \qquad (2)$$

where $\varepsilon_{Li}$ is the plated lithium volume fraction, t is time, $M_{Li}$ is the atomic mass of lithium (g/mol), and $\rho_{Li}$ is the density of lithium metal (g/m³). In equation (2), the first term is contributed by the plating reaction, which may be positive or negative depending on the plating over potential $\eta_p$. The second term is contributed by side reactions. If the side reaction is physical accumulation, the term can be positive or negative. If the side reaction is chemical in nature (e.g., reaction with electrolyte), the term will be always negative.

Figure 8:
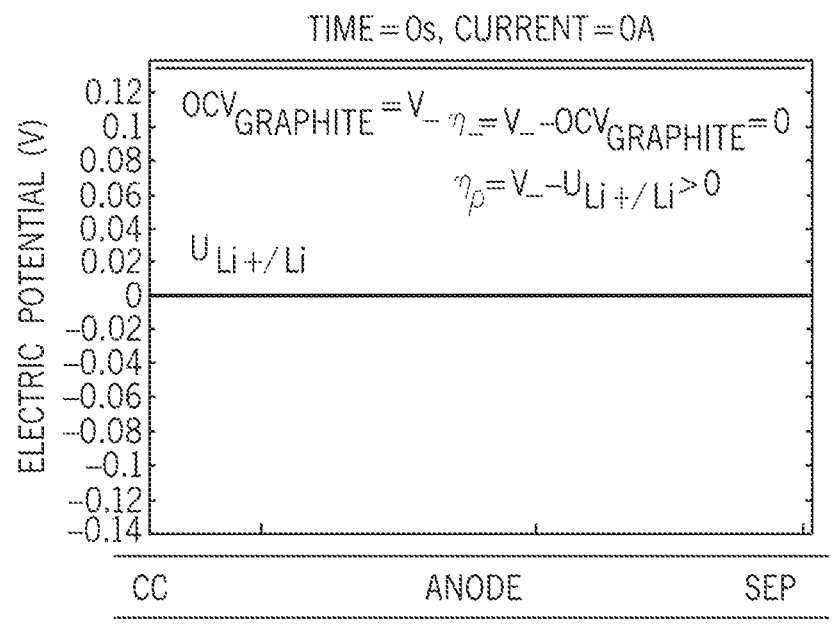
FIGS. 8 and 9 are plots of potential as a function of position at an anode of a battery cell during an initial state in which the battery cell is not being charged, and a state in which the battery cell is being charged, respectively, in accordance with an embodiment of the present approach.
Figure 9:
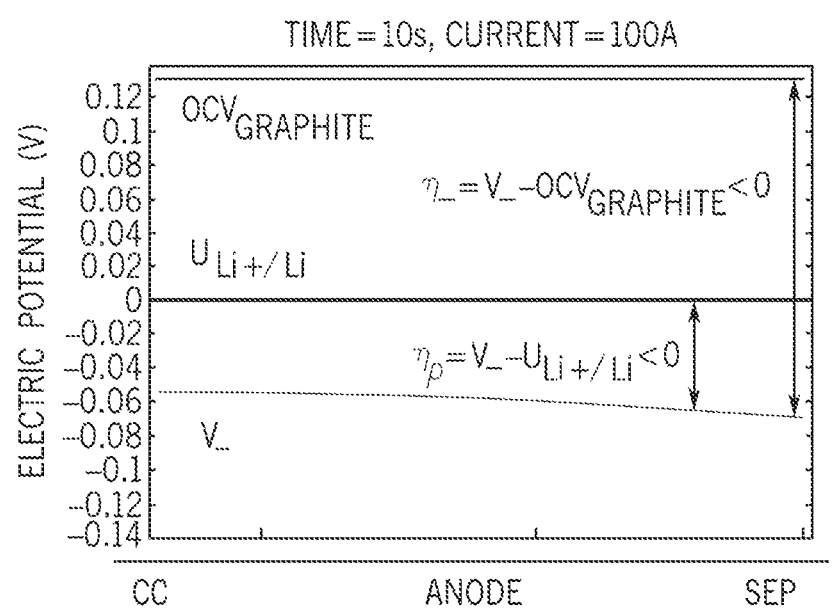
Figure 10:
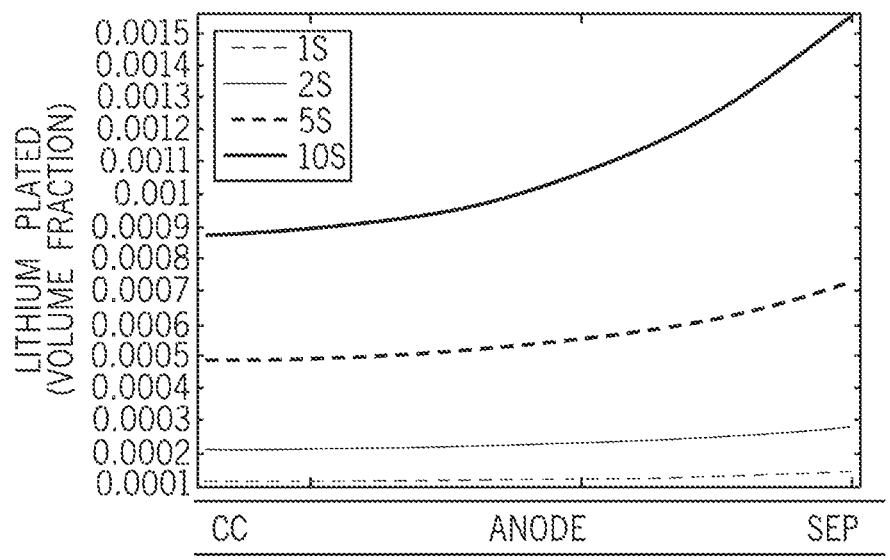
FIG. 10 is a plot of plated lithium growth as a function of anode position for various charging current pulse durations according to the battery cell charging represented in FIG. 9, in accordance with an embodiment of the present approach.

To demonstrate the manner in which equations (1) and (2) relate to plating dynamics, FIGS. 8, 9, and 10 present a situation where a constant current 100 A 10 s pulse was applied to a lithium ion battery cell at T=0° C. and SOC=50%. Unless otherwise noted, the battery simulations described herein are based on a battery having NMC as the cathode active material, and graphite as the anode active material. FIG. 8 shows the various potentials of the anode 50 (as a function of position relative to the current collector (CC) and the separator (Sep)) for the initial state when current is zero. The $U_{Li+/Li}$=0V, is the reference potential. The potential of the negative electrode, $V_-$=$OCV_{graphite}$, is about 120 mV, which corresponds to the open circuit voltage of a graphite anode at 50% SOC. Since there is no current, the over potential for the main anode reaction, $\eta_-$=$V_-$-$OCV_{graphite}$=0. As a result the over potential for the plating reaction, $\eta_p$=$V_-$-0[V]>0 indicating that lithium plating has not happened.

Note that in equation (1) when $\eta_p$>0, the anodic term in the equation dominates and there is no lithium plating.

FIG. 9 illustrates the various potentials at the end of the charge pulse. Here, the negative electrode potential, $V_1$, is significantly lowered to maintain a negative over potential $\eta_-$ and thus supports reacting current in the anode 50. Meanwhile, the over potential for the lithium plating reaction, $\eta_p$, goes negative as well and then plating happens (the cathodic term in equation (1) wins over the anodic term).

FIG. 10 illustrates the evolution of plated lithium which grows along charging time. In other words, longer charging current pulses result in a larger volume fraction of plated lithium. Here, lithium is plated more at the interface of the anode 50 and the separator 54 than at the interface between the anode 50 and the current collector which is reasonable because there is a resistance for lithium ions to migrate and diffuse from separator to collector and reactions are favored at the anode 50 and the separator 54.

Figure 11:
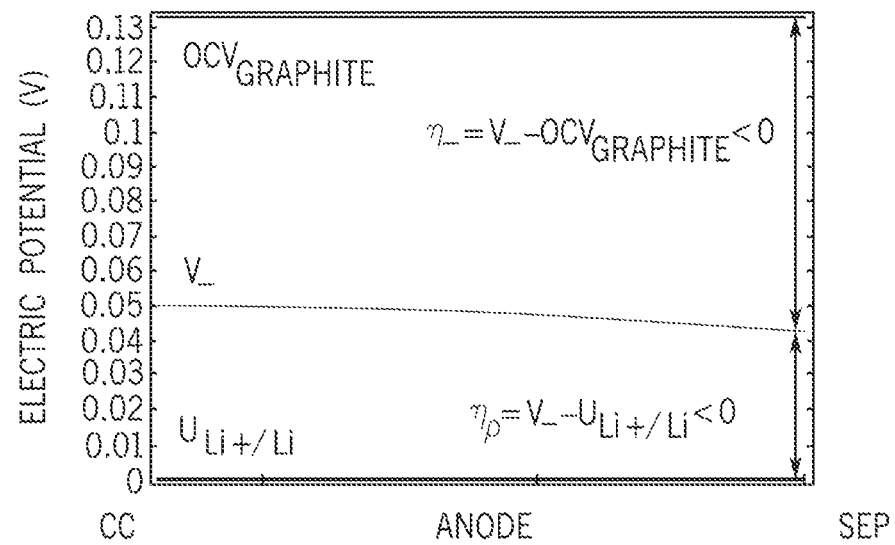
FIG. 11 is a plot illustrating the various electrical potentials across the anode after the charging current has stopped, in accordance with an embodiment of the present approach.
Figure 12:
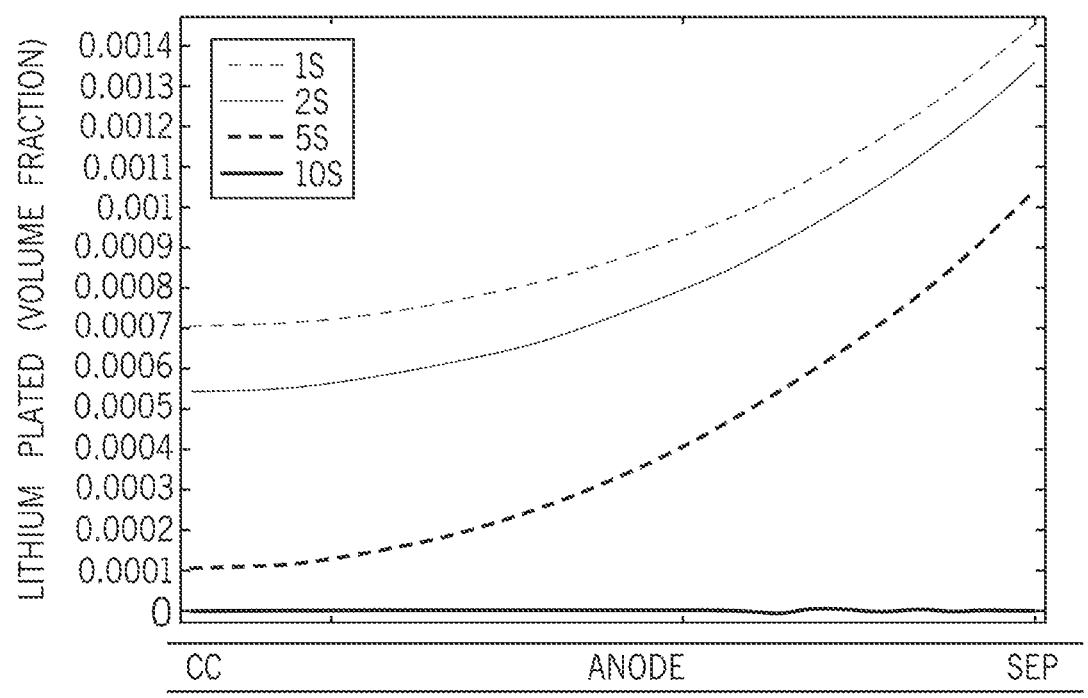
FIG. 12 is a plot of plated lithium amount as a function of anode position for various charging current pulse durations after the charging pulse has stopped, in accordance with an embodiment of the present approach.

The plating may be reversed (e.g., via re-insertion of lithium ions into the graphite anode through electrochemical reactions) when the charging stops, as shown in FIGS. 11 and 12. FIG. 11 illustrates the various electrical potentials across the anode 50 after the charging current has stopped for 1 s. As shown, the plating over potential instantly goes back to positive and thus the anodic reaction of equation (1) will dominate and the plated lithium converts to lithium ions and re-insert in graphite through two steps of electrochemical reactions. FIG. 12 demonstrates that the plated lithium has gone away along with relaxation time. It should be noted that FIGS. 11 and 12 illustrate an ideal case where no side reactions occur (the second term of equation (2) is zero). In the ideal case, the plated lithium will not cause any negative effects if they are re-inserted into graphite. However, in reality the side reactions, either physical or chemical, can never be zero. Once the lithium is plated there will always some loss of lithium and will cause some degree of battery degradation. This is one of the reasons plating may cause battery aging.

Returning now to FIG. 5, the BMS 36 may use battery measurements and the electrochemical model 72 to monitor and/or quantify lithium plating, at block 100. It should be noted that the electrochemical model 72 may be used directly in performing the acts according to block 100, or may be used to construct, for example, look-up tables, current limit maps, and the like, which are used directly to monitor and/or quantify lithium plating. The look-up tables, current limit maps, or similar features (e.g., an equivalent circuit model) may reduce the computational cost associated with performing the acts of block 100, which may be desirable to allow the BMS 36 to control the operation of the lithium ion battery module 30 in a more efficient manner. For example, a time cost for dynamically changing charging parameters may be reduced by simplifying the algorithmic structure associated with monitoring and subsequently controlling the charging of the lithium ion battery module 30 to prevent lithium plating.

As an example, a look-up table generated using the electrochemical model 72 may relate various measurable factors of the lithium ion battery module 30 to evaluate aspects of lithium plating at the anode 50. For example, one or more look-up tables may provide a mechanism for relating the temperature, state of charge, current pulse duration and level, and the like, of the battery cells 42 of the lithium ion battery module 30 to the likelihood of lithium plating. Accordingly, one or more look-up tables may enable the BMS 36 to identify the onset of lithium plating on the anode 50, and to quantify lithium plating on the anode 50 based on the electrochemical model 72.

Thus, at block 100, measurable factors of the lithium ion battery module 30 may be applied to the electrochemical model 72, to one or more look-up tables based on the electrochemical model 72, to an equivalent circuit model based on the electrochemical model 72, or the like, to identify lithium plating onset, to monitor lithium plating kinetics, to quantify lithium plating, or any combination thereof. Again, the measurable factors may include, but are not necessarily limited to, state of charge, temperature, and similar factors.

Subsequently, at block 102, charging operations may be controlled by the BMS 36 based on the monitored and/or quantified lithium plating. For example, the BMS 36 may control the alternator 18, or other feature responsible for delivering current to the lithium ion battery module 30, to adjust the charging current limit and/or pulse duration provided to the lithium ion battery module 30. Such control may be performed in response to determining that quantified lithium plating or observed lithium plating kinetics meet a predetermined criterion.

As set forth above with respect to the acts associated with block 100, the electrochemical model 72 may be used to generate a number of useful tools, such as look-up tables, equivalent circuit models, current limit maps, and so forth. Indeed, as noted, it is now recognized that the current limit associated with pulsed charging operations is a strong function of a state of charge (SOC) of the lithium ion battery module 30 (or, more simply, battery cell 42). Indeed, the present disclosure enables the determination of current limits for preventing lithium plating, as well as lithium plating quantification, using the electrochemical model 72.

Figure 13:
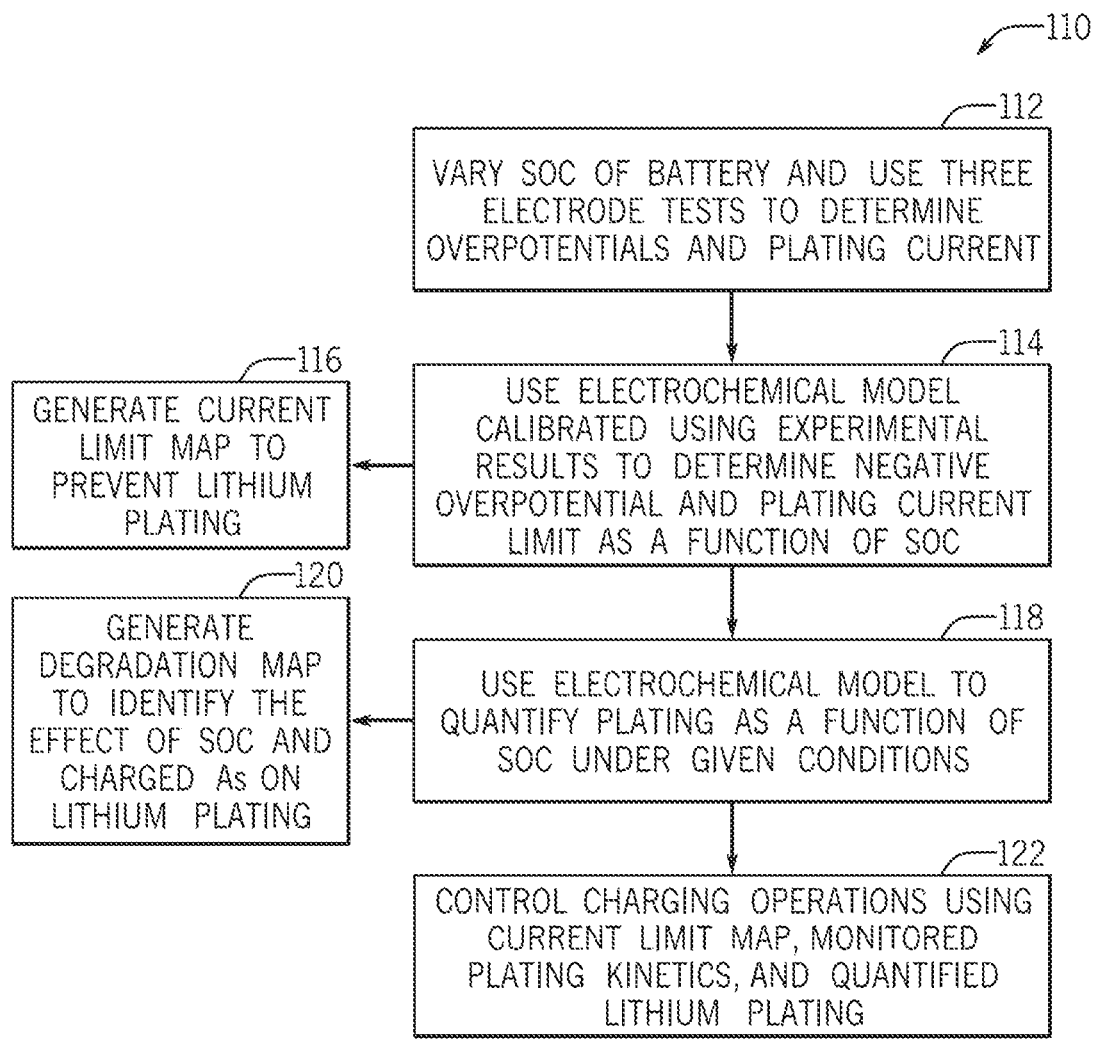
FIG. 13 is a process flow diagram describing a method for reducing the likelihood of lithium plating on an anode of a battery based on current limit maps, degradation maps, and monitored lithium plating kinetics generated by an electrochemical model of the battery, in accordance with an embodiment of the present approach.

FIG. 13 is a process flow diagram of a method 110 of using the electrochemical model 72 to generate current limit maps for specific lithium ion batteries for eventual control of the batteries to balance lithium plating and battery performance. At block 112, a lithium ion battery (e.g., battery cell or battery module) having a particular chemistry (a particular combination of positive and negative active materials and electrolyte) is subjected to three-electrode tests at different SOC levels of the battery. Overpotentials for the negative and positive electrodes (anode and cathode) of the battery are obtained using the three-electrode tests, which enables a determination of the true plating current limit for the battery.

The electrochemical model 72 may be calibrated using such test results, and at block 114, the trained electrochemical model 72 is used to determine the negative overpotential for a simulated battery of similar construction. This enables the plating current limit as a function of SOC to be determined for the battery. It should be noted that the battery simulation may be performed using a battery simulation system constructed using the test results obtained at block 112, using various battery design parameters, and so forth. The battery simulation system may be constructed in a modeling environment (e.g., a physics-based modeling environment) such as COMSOL Multiphysics®, run on a programmable device by programming the device and the environment with particular battery characteristics, appropriate electrochemical models, and so forth.

Figure 15:
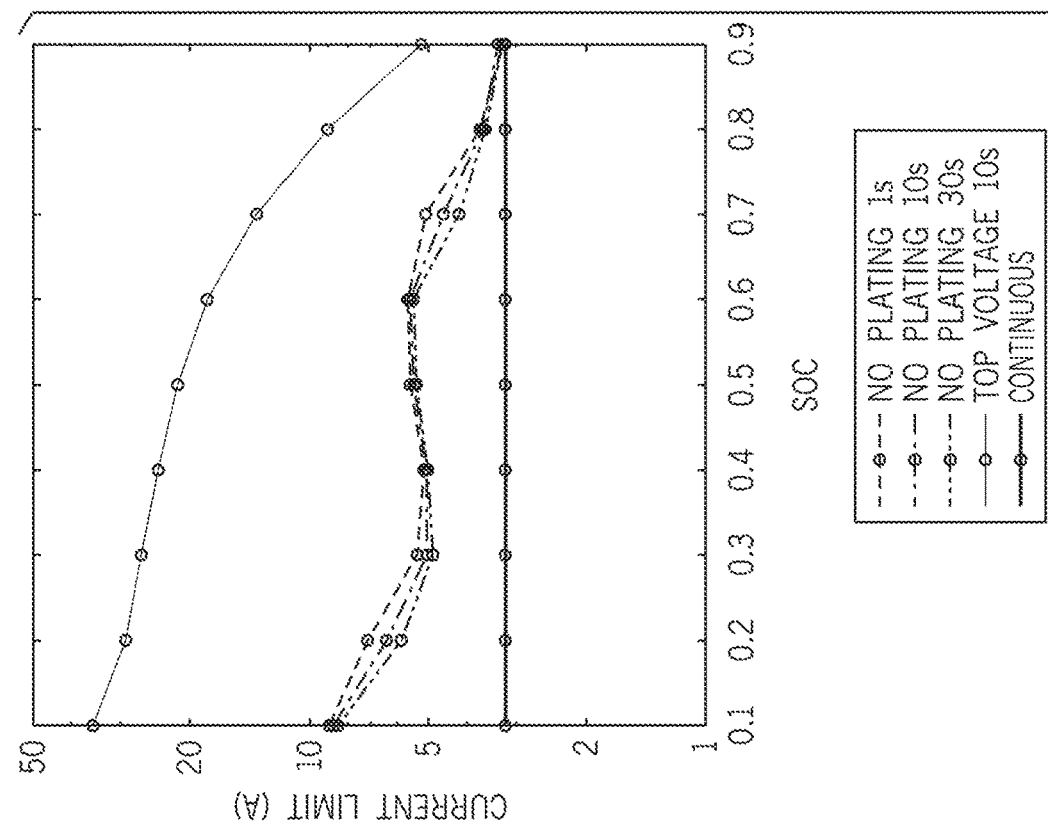
FIGS. 14 and 15 are example current limit maps generated by the electrochemical model, in accordance with an embodiment of the present approach.
Figure 14:
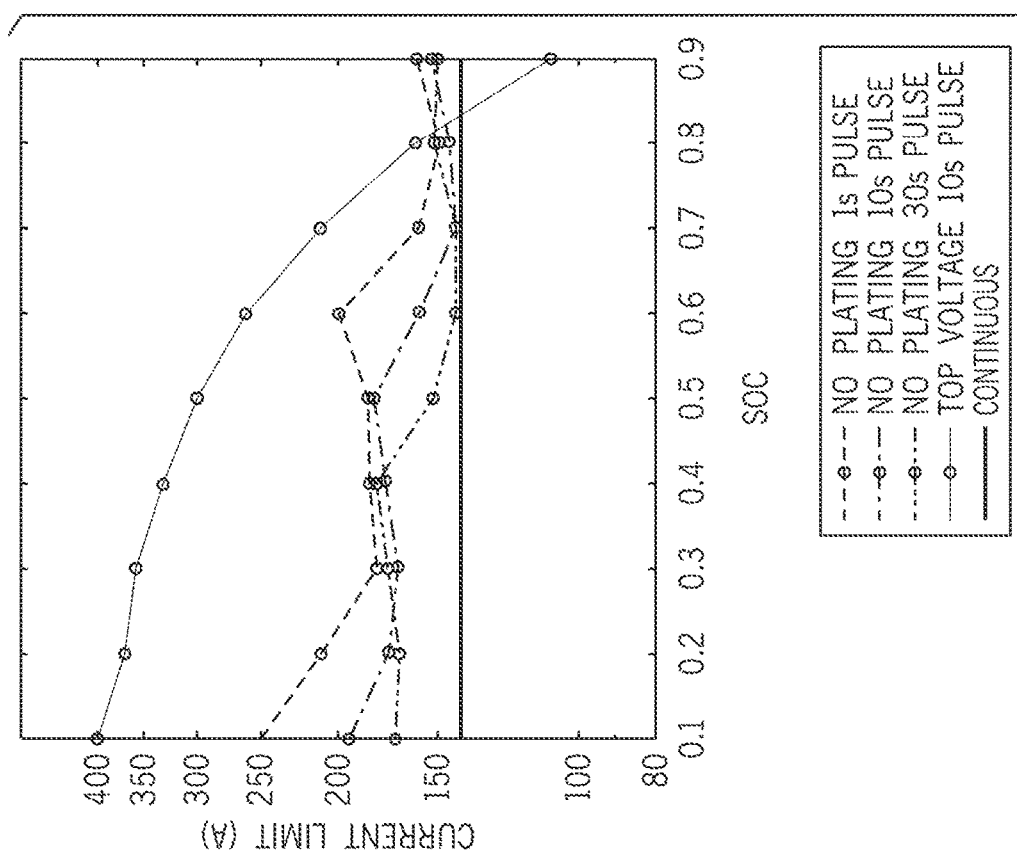

Once the battery simulation system is appropriately programmed, various parameters can be varied, including SOC and temperature, among others, to model the behavior of a simulated battery. Indeed, as shown at block 116, a current limit map to prevent lithium plating may be generated. FIGS. 14 and 15 are example plots of modeled plating current limits as a function of SOC at 25° C. and −25° C., respectively. As shown, the plating current limits for pulsed charging currents are a strong function of SOC, while the plating current limit for continuous charging currents does not vary with SOC but has an overall much lower threshold. As can be seen from these plots, current limits for preventing plating are a function of temperature, SOC, and current duration.

Top charge voltage is a standard specification for a lithium ion battery, because overcharge may cause over oxidation of the cathode and plating at the anode. The top voltages normally are different for continuous and pulse charging conditions. In the plots, the "top voltage" curve represents the current limit for a 10 s charge pulse to reach a top voltage of the battery (e.g., 4.2V).

FIGS. 14 and 15 also demonstrate that a single simple maximum voltage limit specification may not necessarily prevent lithium plating. Only under very specific conditions, such as high SOC and room temperature is the current limit based on top voltage lower than the current limit for preventing plating as defined for a continuous charge specification.

At block 118, the electrochemical model 72 may also be used to quantify plating as a function of SOC under a particular set of conditions. For example, the given set of conditions may represent conditions often experienced when the battery is used in a particular application (e.g., in a particular type of vehicle or under certain driving conditions). Lithium plating quantification may be an important factor in control strategy for the lithium ion battery module 30 in embodiments where it may be desirable to balance the amount of lithium that is allowed to plate on the anode 50 with desired charging parameters for the lithium ion battery module 30.

Figure 16:
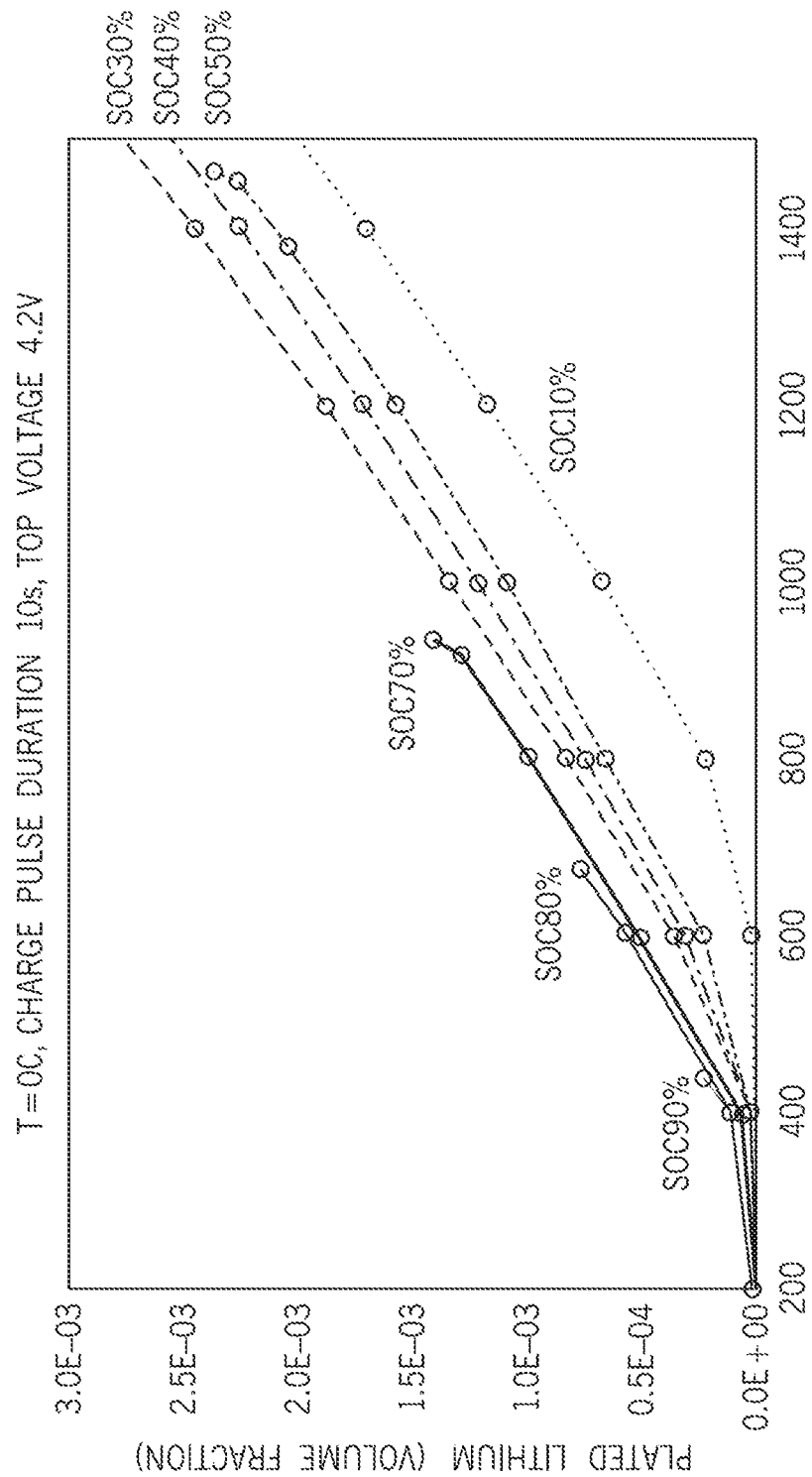
FIG. 16 is an example battery degradation map generated by the electrochemical model by quantifying lithium plating, in accordance with an embodiment of the present approach.

In accordance with certain embodiments, determining the amount of plating may allow for the generation of a degradation map, as shown at block 120. FIG. 16 is an example of such a degradation map, which compares the quantity of plated lithium for a fixed 10 s charge pulse at various SOC levels. As shown, the plated lithium varies with SOC and charged As. At high SOC, less lithium plating is observed because the charge current has been cut by an upper voltage limit. At low SOC without a voltage limit, the plated lithium varies with SOC. This indicates there is room in controlling charging operations to minimize the plating while keeping the simple control of a single voltage limit, for example when the battery is estimated to be within a certain SOC range. A temperature and SOC-dependent current de-rating (or charging) strategy could be applied to minimize the plating. For example, less lithium plates on the anode 50 when the battery cell is charged at 50% SOC than at 30% SOC.

The illustrated method 110 of FIG. 13 also includes controlling charging operations at block 122. According to block 122, the charging operations may be controlled based on the current limit map, the monitored lithium plating kinetics, quantified lithium plating, the degradation map, or any combination of these, in response to changes in various monitored parameters. As set forth above, the monitored parameters may include charging current levels, a SOC of the battery, a temperature of the battery, pulse durations, and so forth. Specifically, the BMS 36 may monitor the parameters, compare the monitored values of these parameters against outputs of the electrochemical model 72 (which may include any one or a combination of the current limit maps, degradation maps, look-up tables, and so forth), and adjust charging operations for the lithium ion battery module 30 accordingly.

Figure 17:
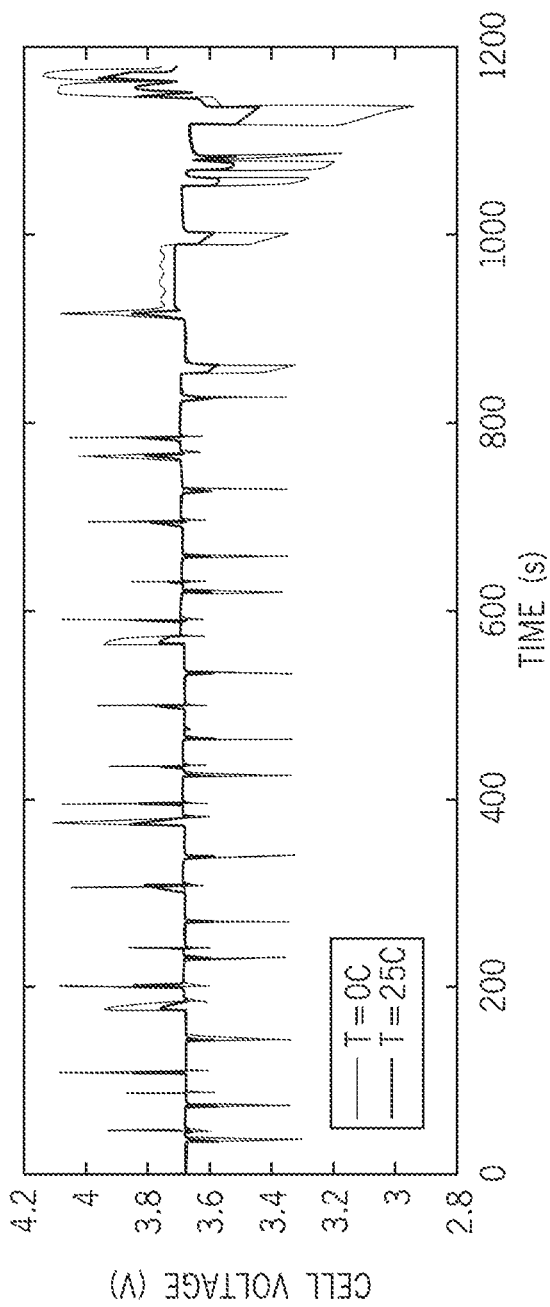
FIGS. 17 and 18 illustrate driving profile simulation results for battery voltage and battery current, respectively, at a constant temperature T=25° C. and T=0° C., for a simulated battery, in accordance with an embodiment of the present approach.
Figure 18:
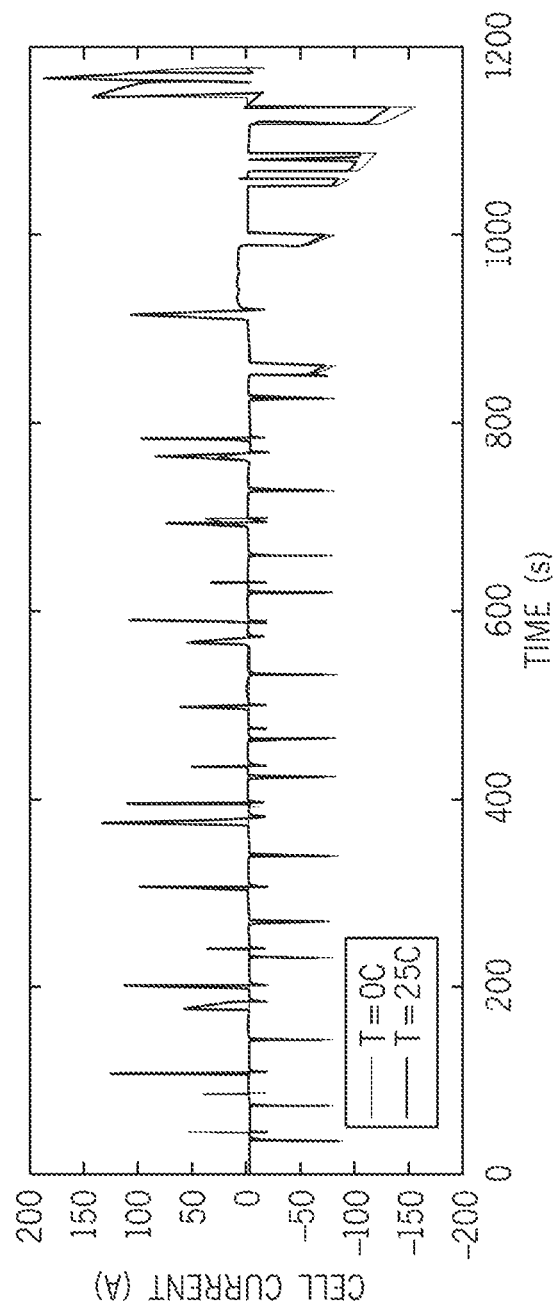

While described in terms of regular pulses applied to the lithium ion battery module 30 (or to the lithium ion battery cell 42), the performance evaluation based on standard pulses can be quite different from the performance evaluation based on driving cycle because the real-world driving cycles often include irregular charge and discharge pulses. Rest time and the sequence of charge and discharge may play a role in ultimate performance. Accordingly, the BMS 36 may also utilize the electrochemical model 72 to monitor the performance of the lithium ion battery module 30 over time. FIGS. 17 and 18 illustrate driving profile simulation results for battery voltage and battery current, respectively, at a constant temperature T=25° C. and T=0° C. in which the temperature rise due to internal heating has been ignored. In this simulation, the lithium ion battery module 30 has 13 lithium ion battery cells in series representing a 48V system application.

Figure 19:
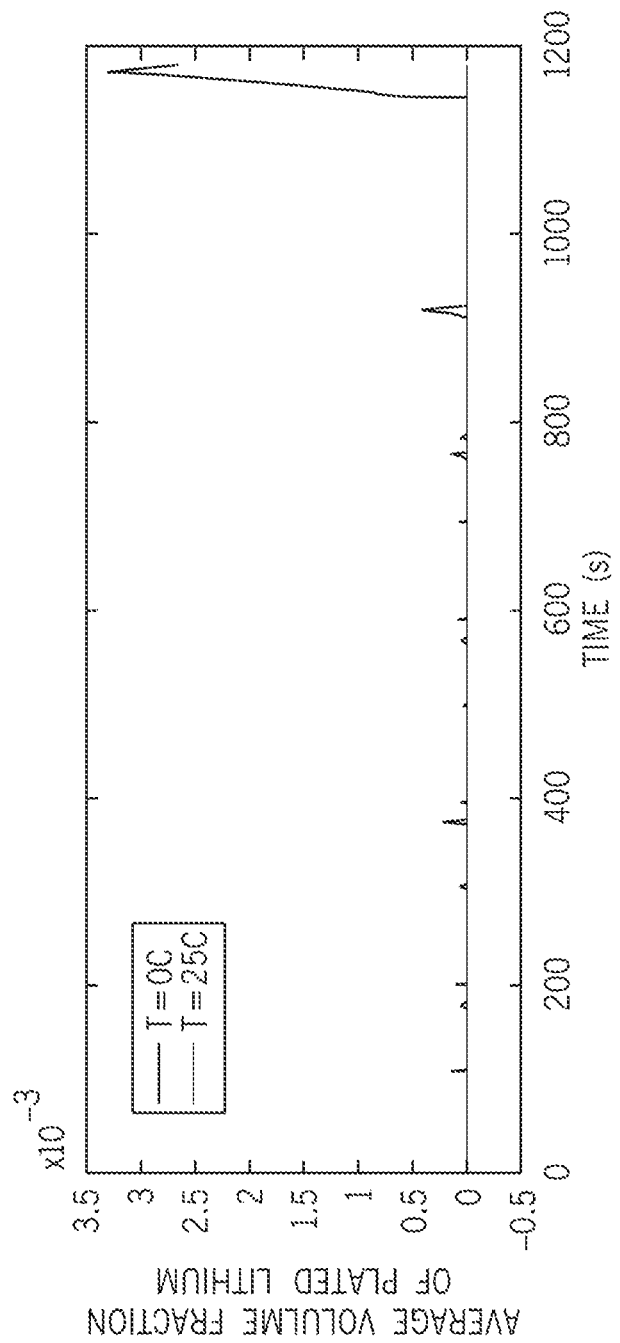
FIG. 19 is a plot of average volume fraction of plated lithium corresponding to the simulated driving profiles described in FIGS. 17 and 18, in accordance with an embodiment of the present approach.

Because battery cell resistance is much higher at low temperature, the battery voltage spans in a wider range at 0° C. than at 25° C. Due to the system voltage cutoff (54V is assumed), the battery at 0° C. is not capable of accepting all regen currents. FIG. 19 illustrates the evolution of the average volume fraction of plated lithium corresponding to the simulated driving profiles. It is seen that at T=25° C.

there is no plating accumulation. However, for T=0° C., the regen has induced some lithium plating. As illustrated, the last pulse has contributed significantly to the total plating. The driving cycle simulation is believed to be consistent with the current limit maps of FIGS. 14 and 15. Indeed, lithium plating may not necessarily lead to capacity loss as long as the lithium can be re-inserted into the anode 50. However, if there are certain side reactions and the side reactions can be quantified, the capacity loss contributed by lithium plating can be estimated by the BMS 36 using the electrochemical model 72. Estimating the capacity loss in this manner may provide an accurate measure of aging of the lithium ion battery module 30.

The electrochemical model 72 described herein may also be useful for simulating characteristics, including lithium plating, for a variety of battery cell designs. Indeed, a variety variables exist for cell level design such as coating thickness, porosity, materials formula, particle size. The optimal design depends on balance of requirement and cost. For example, thicker coatings allow more active materials packed in limited space favoring higher energy density and lower cost. Accordingly, one major difference between a "power cell" and an "energy cell" is the thickness of active material coated onto the current collector of the cell.

Figure 21:
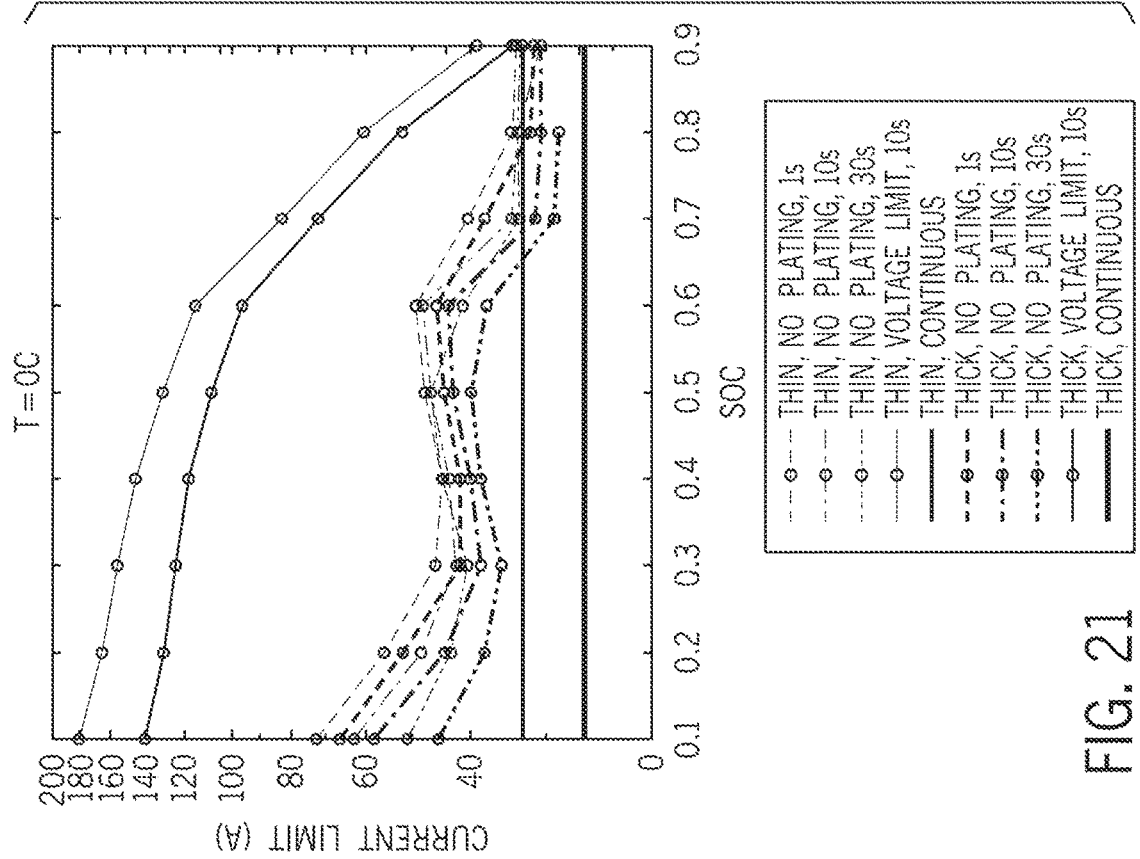
FIGS. 20 and 21 depict current limit maps for T=25° C. and 0° C., respectively, for a relatively thin (power cell) and relatively thick electrode (energy cell) designs generated using an electrochemical model, in accordance with an embodiment of the present approach.
Figure 20:
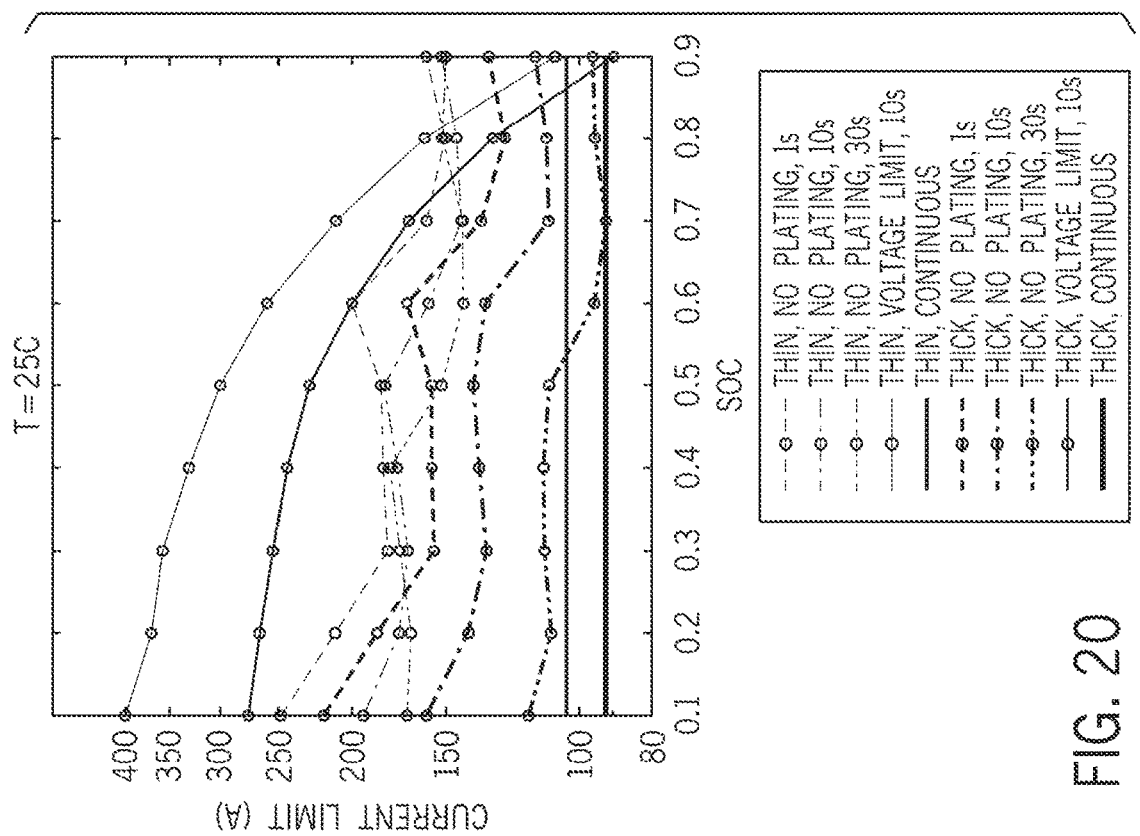

Accordingly, the effect of coating thickness may be modeled using the electrochemical model 72 to acquire a measure of how energy cell vs power cell design may affect the current limit to prevent lithium plating. FIGS. 20 and 21 depict current limit maps for T=25° C. and 0° C., respectively, for relatively thin (power cell) and relatively thick electrode (energy cell) designs, where the energy cell design has a coating thickness that is approximately four-fold greater than the power cell design. As shown, the current limit is significantly affected by the active material thickness. This demonstrates that thicker coatings cause higher diffusion resistance and the negative over potential has a sharper slope from the electrode/separator interface to the electrode/collector interface. There is a higher chance plating occurs at the electrode/separator interface. Table 1 uses 50% SOC as an example to demonstrate the extent of current limit reduction when using an energy cell design versus a power cell design.

TABLE 1

Comparison of modeled current limits for a power cell (thin coating) and an energy cell (thicker) design

| Current limit of | T = 25° C. | | T = 0° C. | |
|---|---|---|---|---|
| | Power design | Energy design | Power design | Energy design |
| Continuous charge to prevent plating | 140 A | 92 A | 33 A | 26 A |
| 1 s pulse to prevent plating | 183.4 A | 157.0 A | 47.7 A | 43.3 A |
| 10 s pulse to prevent plating | 180.7 A | 138.3 A | 46.7 A | 42.6 A |
| 30 s pulse to prevent plating | 152.2 A | 109.7 A | 46.6 A | 39.9 A |
| 10 s pulse to reach 4.2 V | 300 A | 228 A | 130 A | 108 A |

One or more of the disclosed embodiments, alone or on combination, may provide one or more technical effects including decreasing the likelihood of lithium plating on the anode 50 of the lithium ion battery module 30. For example, the disclosed electrochemical model may be used to study how plating occurs and analyze factors that influence plating in a battery cell. For example, current limits for preventing plating generated using the disclosed electrochemical model can be quite different from current limits based on maximum voltage limits, and may more accurately predict battery cell behavior when accounting for lithium plating in battery charging operations. The technical effects and technical problems in the specification are exemplary and are not limiting. It should be noted that the embodiments described in the specification may have other technical effects and can solve other technical problems.

While only certain features and embodiments have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the disclosed subject matter. The order or sequence of any process or method steps may be varied or re-sequenced according to alternative embodiments. It is, therefore, to be understood that the appended claims are intended to cover all such modifications and changes as fall within the true spirit of the disclosure. Furthermore, in an effort to provide a concise description of the exemplary embodiments, all features of an actual implementation may not have been described. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A battery system, comprising:
a lithium ion battery configured to couple to an electrical system;
a battery management system configured to electrically couple to the lithium ion battery and configured to control one or more recharge parameters of the lithium ion battery, wherein the battery management system is programmed with an electrochemical model;
the electrochemical model having a determination of at least one of a lithium plating reaction kinetics at an anode of the lithium ion battery and a quantity of plated lithium at the anode of the lithium ion battery, and an indication of a relationship between the one or more recharge parameters and the lithium plating reaction kinetics, the quantity of plated lithium, or a combination thereof; and
the determination and the indication having one or more outputs for an adjustment of a plating current limit for charging operations of the lithium ion battery to prevent lithium plating at the anode.

2. The battery system of claim 1, wherein the battery management system is configured to control charging current provided to the lithium ion battery as a function of the one or more outputs generated by the electrochemical model relating to the lithium plating at the anode.

3. The battery system of claim 2, wherein the battery management system is configured to control pulse duration and current level of the charging current as a function of a state of charge of the lithium ion battery according to plating current limits generated by the electrochemical model.

4. The battery system of claim 3, wherein the battery system is configured to adjust the plating current limit.

5. The battery system of claim 2, wherein the battery management system is configured to control pulse duration and current level of the charging current as a function of a state of charge of the lithium ion battery and a temperature of the lithium ion battery according to plating current limits generated by the electrochemical model.

6. The battery system of claim 1, wherein the electrochemical model comprises equations describing lithium plating reaction kinetics and quantifying plated lithium as a function of the lithium plating reaction kinetics.

7. The battery system of claim 1, wherein the electrochemical model comprises an equation that describes Butler-Volmer kinetics of a lithium plating reaction at the anode of the lithium ion battery.

8. The battery system of claim 1, wherein the electrochemical model comprises a second equation that calculates plated lithium as a result of the reaction occurring at the anode and side reactions involving plated lithium at the anode.

9. The battery system of claim 8, wherein with the battery management system is configured to use the electrochemical model to evaluate battery degradation due to the side reactions involving plated lithium at the anode.

10. The battery system of claim 1, wherein the adjustment is according to a current limit map generated by the electrochemical model, with the adjustment based on the electrochemical model and the one or more recharge parameters.

11. The battery system of claim 10, wherein the current limit map describes plating current limit as a function of a temperature and a state of charge of the lithium ion battery for a variety of charging current pulse durations.

12. The battery system of claim 1, wherein the lithium ion battery has a plurality of battery cells, at least one battery cell of the plurality of battery cells having a carbon-based anode active material.

13. A method to control a charging operation of a lithium ion battery, comprising:
monitoring one or more parameters of the lithium ion battery during the charging operation by a battery management system communicatively coupled to the lithium ion battery;
determining lithium plating reaction kinetics at an anode of the lithium ion battery using an electrochemical model, determining a quantity of plated lithium at the anode of the lithium ion battery, or a combination thereof, by the battery management system;
indicating a relationship by the battery management system between the one or more monitored parameters and the lithium plating reaction kinetics, the quantity of plated lithium, or the combination thereof using the electrochemical model; and
controlling the charging operation of the lithium ion battery by the battery management system based on the indicated relationship by adjusting a plating current limit according to a current limit map.

14. The method of claim 13, comprising:
varying a state of charge of the lithium ion battery and performing electrochemical tests to determine overpotentials of cathode and an anode of the lithium ion battery and a plating current associated with lithium plating at the anode;
calibrating the electrochemical model using results from the electrochemical tests to model a negative overpotential and a plating current limit as a function of a state of charge of the lithium ion battery; and
generating the current limit map to prevent lithium plating using the modeled plating current limit, wherein the current limit map describes the plating current limit as a function of a temperature and a state of charge of the lithium ion battery for a variety of charging current pulse durations.

15. The method of claim 14, wherein the indicated relationship is the current limit to be used for pulse charging of the lithium ion battery, the current limit being based on a correlation between monitored state of charge, monitored temperature, and a duration of charging current pulses defined by the current limit map.

16. The method of claim 13, wherein the electrochemical model comprises equations describing lithium plating reaction kinetics and quantifying plated lithium as a function of the lithium plating reaction kinetics.

17. A lithium ion battery comprising:
a housing;
a plurality of lithium ion battery cells disposed in the housing;
one or more sensors disposed in the housing and configured to monitor one or more parameters of the plurality of lithium ion battery cells;
a battery management system communicatively being coupled to the one or more sensors, disposed in the housing and configured to control a charging operation of the lithium ion battery, with the battery management system being programmed with an electrochemical model comprising equations; and
the battery management system being configured to dynamically control the charging operation of the lithium ion battery based on the one or more monitored parameters and the electrochemical model to prevent lithium plating at an anode of the plurality of lithium ion battery cells, including dynamically adjust a plating current limit for pulsed current charging operations of the lithium ion battery to prevent the lithium plating at the anode according to a current limit map generated by the electrochemical model.

18. The lithium ion battery of claim 17, wherein the equations describe lithium plating reaction kinetics and quantify the lithium plating as a function of the lithium plating reaction kinetics.

19. The lithium ion battery of claim 17, wherein the electrochemical model comprises an equation that describes Butler-Volmer kinetics of a lithium plating reaction at the anode of the plurality of lithium ion battery cells.

20. The lithium ion battery of claim 17, wherein the electrochemical model comprises an equation that calculates plated lithium as a result of a plating reaction occurring at the anode and side reactions involving plated lithium at the anode.

* * * * *